(12) United States Patent
Du et al.

(10) Patent No.: US 11,978,866 B2
(45) Date of Patent: May 7, 2024

(54) METHOD FOR CORRECTING SOC OF BATTERY PACK, BATTERY MANAGEMENT SYSTEM AND VEHICLE

(71) Applicant: Contemporary Amperex Technology Co., Limited, Ningde (CN)

(72) Inventors: Mingshu Du, Ningde (CN); Shichao Li, Ningde (CN); Jian Ruan, Ningde (CN); Yizhen Hou, Ningde (CN); Yanhua Lu, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 664 days.

(21) Appl. No.: 17/138,433

(22) Filed: Dec. 30, 2020

(65) Prior Publication Data

US 2021/0119275 A1 Apr. 22, 2021

Related U.S. Application Data

(63) Continuation of application No. PCT/CN2020/084331, filed on Apr. 11, 2020.

(30) Foreign Application Priority Data

May 16, 2019 (CN) .......................... 201910405478.5

(51) Int. Cl.
*H02J 7/00* (2006.01)
*H01M 10/42* (2006.01)
(Continued)

(52) U.S. Cl.
CPC ..... *H01M 10/446* (2013.01); *H01M 10/4257* (2013.01); *H02J 7/0048* (2020.01);
(Continued)

(58) Field of Classification Search
CPC ...... H02J 9/02; H02J 7/34; H02J 9/065; H02J 7/0068; H02J 7/345; H02J 9/061;
(Continued)

(56) References Cited

U.S. PATENT DOCUMENTS

2013/0043876 A1* 2/2013 Liu .................. G01R 31/3842
324/426
2014/0125344 A1* 5/2014 Knight ................. G01R 31/367
324/426

(Continued)

FOREIGN PATENT DOCUMENTS

CN 102468521 A 5/2012
CN 104730468 A 6/2015
(Continued)

OTHER PUBLICATIONS

The extended European search report for EP Application No. 20806075.6, dated Jul. 27, 2021, 9 pages.
(Continued)

*Primary Examiner* — Binh C Tat
(74) *Attorney, Agent, or Firm* — East IP P.C.

(57) ABSTRACT

Embodiments of the present invention relate to the field of circuit technology, and disclose a method for correcting a SOC of a battery pack, a battery management system, and a vehicle. The method for correcting an SOC of a battery includes: determining, when a charging process of the battery pack starts, whether an initial SOC value of the battery pack is less than or equal to a preset electricity quantity threshold; when the initial SOC value of the battery pack is less than or equal to the preset electricity quantity threshold, recording state information of the battery pack during the charging process, and generating a differential capacity curve of the battery pack according to the state information; correcting a current SOC value of the battery pack according to the differential capacity curve and a
(Continued)

voltage-SOC reference curve of a non-decay zone of the battery pack.

16 Claims, 5 Drawing Sheets

(51) Int. Cl.
*H01M 10/44* (2006.01)
*B60L 58/12* (2019.01)
*B60L 58/16* (2019.01)

(52) U.S. Cl.
CPC .............. *B60L 58/12* (2019.02); *B60L 58/16* (2019.02); *H01M 2010/4271* (2013.01)

(58) Field of Classification Search
CPC .......... H02J 13/00006; H02J 13/00017; H02J 7/0048; H02J 7/00034; H02J 7/0013; H02J 7/0044; H02J 7/0047; H02J 2310/22; H02J 7/005; H02J 2207/50; H02J 7/00; H02J 7/007; H02J 7/007192; H02J 7/007184; H02J 1/10; H02J 7/0045; H02J 7/0069; H02J 7/0042; H02J 7/00711; H02J 7/00714; H02J 7/00032; H02J 7/00036; H02J 7/00047; H02J 7/0014; H02J 7/0016; H02J 7/0024; H02J 7/0029; H02J 7/0071; H02J 13/00002; H02J 2203/10; H02J 2203/20; H02J 2207/30; H02J 3/32; H02J 3/322; H02J 3/472; H02J 50/10; H02J 7/0025; H02J 7/0049; H02J 7/0063; H02J 7/007188; H02J 7/342; B60L 53/11; H01M 2220/20; H01M 2010/4271; H01M 10/4257; H01M 10/465; H01M 10/615; H01M 10/44; H01M 10/63; H01M 10/443; H01M 10/486; H01M 10/0525; H01M 10/052; H01M 10/4207; H01M 10/654; H01M 10/657; H01M 2200/00; H01M 10/425; H01M 10/637; H01M 10/42; H01M 10/48; H01M 10/482; H01M 10/06; H01M 10/4242; H01M 10/625; H01M 10/6571; H01M 2010/4278; H01M 10/4285; H01M 10/441; H01M 10/446; H01M 16/00; H05B 47/19; H05B 45/00
USPC .................................................. 320/137–143
See application file for complete search history.

(56) References Cited

U.S. PATENT DOCUMENTS

| | | | |
|---|---|---|---|
| 2015/0108950 A1* | 4/2015 | Yun | H02J 7/00712 |
| | | | 320/134 |
| 2017/0212170 A1 | 7/2017 | Torai et al. | |
| 2018/0128880 A1 | 5/2018 | Miyamoto et al. | |
| 2019/0195956 A1* | 6/2019 | Lim | G01R 31/392 |

FOREIGN PATENT DOCUMENTS

| | | |
|---|---|---|
| CN | 105388422 A | 3/2016 |
| CN | 105510832 A | 4/2016 |
| CN | 105548912 A | 5/2016 |
| CN | 105703024 A | 6/2016 |
| CN | 105870523 A | 8/2016 |
| CN | 106680725 A | 5/2017 |
| CN | 106707175 A | 5/2017 |
| CN | 106772072 A | 5/2017 |
| CN | 108020791 A | 5/2018 |
| CN | 108470944 A | 8/2018 |
| CN | 108896913 A | 11/2018 |
| CN | 109143078 A | 1/2019 |
| CN | 109164398 A | 1/2019 |
| CN | 110967644 A | 4/2020 |
| DE | 102013206188 A1 | 10/2014 |
| EP | 2711727 A2 | 3/2014 |
| EP | 3159708 A1 | 4/2017 |
| EP | 3410138 A1 | 12/2018 |
| JP | 2017200312 A | 11/2017 |

OTHER PUBLICATIONS

Office Action in Chinese Application No. 201910405478.5, issued Aug. 7, 2020, 7 pages.
International Search Report for Application No. PCT /CN2020/ 084331, mailed Jul. 6, 2020, 11 pages.

* cited by examiner

METHOD FOR CORRECTING SOC OF BATTERY PACK, BATTERY MANAGEMENT SYSTEM AND VEHICLE

CROSS-REFERENCE TO RELATED APPLICATIONS

This application is a continuation of International Application No. PCT/CN2020/084331, filed on Apr. 11, 2020, which claims priority to Chinese Patent Application No. 201910405478.5, filed on May 16, 2019, both of which are hereby incorporated by reference in their entireties.

TECHNICAL FIELD

Embodiments of the present invention relate to the field of circuit technology, and in particular, to a method for correcting a SOC of a battery pack, a battery management system, and a vehicle.

BACKGROUND

With the development of battery technology, to replace fossil-fuelled vehicles with electric vehicles is the trend of the development of the automobile industry. A battery state of charge (State of Charge, SOC for short) of an electric vehicle characterizes a SOC value of a battery. It is of great significance, for the utilization of the electric vehicle, to grasp the situation of the SOC of the battery timely and accurately during the use of the electric vehicle.

The inventors has found that there are at least the following problems in the prior art: with the ampere hour integration method and the open-circuit voltage method currently being the main methods for battery SOC estimation, the ampere hour integration method is subject to measurement accuracy, a sampling frequency and an error in an initial SOC, resulting in some error in the calculation result, besides, the error will be continuously accumulated over time, which causes the accuracy of battery SOC estimation cannot be guaranteed when the working time for the battery is long; the open circuit voltage method can only be performed after the vehicle has been stationary for a long time, which causes that the battery SOC cannot be updated during charging or driving. In addition, an OCV-SOC curve of the battery will change as the battery ages, further reducing the accuracy of battery SOC estimation.

SUMMARY

Embodiments of the present invention aim to provide a method for correcting a SOC of a battery pack, a battery management system, and a vehicle, so that the SOC value of the battery pack can be corrected during the charging process of the battery pack. Since the voltage-SOC reference curve of the non-decay zone of the battery pack is not be affected by the aging of the battery pack, the influence of battery aging on the calculation of the SOC value of the battery pack is avoided, and the accuracy of the corrected SOC value of the battery pack is improved.

In order to solve the above technical problems, the embodiments of the present invention provide a method for correcting a SOC of a battery pack, where the method includes: determining, when a charging process of the battery pack starts, whether an initial SOC value of the battery pack is less than or equal to a preset electricity quantity threshold; when the initial SOC value of the battery pack is less than or equal to the preset electricity quantity threshold, recording state information of the battery pack during the charging process, and generating a differential capacity curve of the battery pack according to the state information; and correcting a current SOC value of the battery pack according to the differential capacity curve and a voltage-SOC reference curve of a non-decay zone of the battery pack.

The embodiments of the present invention also provide a battery management system, where the battery management system includes at least one processor and a memory communicatively connected with the at least one processor; where the memory has instructions executable by the at least one processor stored thereon, and when executed by the at least one processor, the instructions enable the at least one processor to perform the method for correcting a SOC of a battery pack described above.

The embodiments of the present invention also provide a vehicle, where the vehicle includes: a battery pack and the battery management system described above.

Compared with the prior art, according to the embodiments of the invention, it is determined whether the initial SOC value of the battery pack is less than or equal to the preset electricity quantity threshold when the charging process of the battery pack starts; when the initial SOC value of the battery pack is less than or equal to the preset electricity quantity threshold, the state information of the battery pack during the charging process is recorded, and the differential capacity curve of the battery pack is generated according to the state information; then the current SOC value of the battery pack is corrected according to the differential capacity curve and the non-decay zone of the voltage-SOC reference curve of the battery pack. Therefore, the SOC value of the battery pack can be corrected during the charging process of the battery pack. Since the non-decay zone of the voltage-SOC reference curve of the battery pack is not be affected by the aging of the battery pack, the influence of battery aging on the calculation of the SOC value of the battery pack is avoided, and the accuracy of the corrected SOC value of the battery pack is improved.

In addition, the correcting a current SOC value of the battery pack according to the differential capacity curve and a non-decay zone of a voltage-SOC reference curve of the battery pack may include: acquiring one or more peak position points of the differential capacity curve as one or more first peak position points, and acquiring a peak position point of a differential capacity reference curve corresponding to the voltage-SOC reference curve of the non-decay zone as a second peak position point; and correcting the current SOC value of the battery pack according to the first peak position point and the second peak position point. This embodiment provides a specific implementation for correcting the current SOC value of the battery pack according to the differential capacity curve and the voltage-SOC reference curve of the non-decay zone of the battery pack.

In addition, the correcting the current SOC value of the battery pack according to the first peak position points and the second peak position point may include: determining whether there is a first peak position point that matches the second peak position point; when there is a first peak position point that matches the second peak position point, updating a SOC value corresponding to the first peak position point matching the second peak position point with the a SOC value corresponding to second peak position point; and correcting the current SOC value of the battery pack according to the updated SOC value corresponding to the first peak position point. This embodiment provides a specific implementation for correcting the current SOC value of the battery pack according to the first peak position point and the second peak position point.

In addition, the correcting the current SOC value of the battery pack according to the updated SOC value corresponding to the first peak position point may include: acquiring a charged capacity corresponding to the first peak position point and a current moment charged capacity of the battery pack; calculating the corrected current SOC value of the battery pack according to the charged capacity corresponding to the first peak position point, the current moment charged capacity of the battery pack, and the updated SOC value corresponding to the first peak position point. This embodiment provides a specific implementation for correcting the current SOC value of the battery pack according to the updated SOC value corresponding to the first peak position point.

In addition, the determining whether there is a first peak position point that matches the second peak position point may specifically include: determining whether there is a difference between a voltage corresponding to the first peak position point and a voltage corresponding to the second peak position point that is less than a preset voltage threshold; when the difference between the voltage corresponding to the first peak position point and the voltage corresponding to the second peak position point is less than the preset voltage threshold, determining that the first peak position point matches the second peak position point. This embodiment provides a specific implementation for determining whether there is a first peak position point that matches the second peak position point.

In addition, the electricity quantity threshold may be a lower limit value of any non-decay zone of the battery pack. This embodiment provides a manner for determining the electricity quantity threshold.

In addition, the state information may include: a sequence of voltages and a sequence of currents of the battery pack at fixed time intervals; the generating a differential capacity curve of the battery pack according to the state information includes: generating a charged capacity-voltage curve of the battery pack according to the sequence of voltages and the sequence of currents; calculating the differential capacity curve of the battery pack according to the charged capacity-voltage curve. This embodiment provides a specific implementation for generating the differential capacity curve of the battery pack according to the state information.

In addition, before the correcting a current SOC value of the battery pack according to the differential capacity curve and a voltage-SOC reference curve of a non-decay zone of the battery pack, the method may further include: determining whether the charged capacity of the battery pack reaches a preset charged capacity threshold; when the charged capacity of the battery pack reaches the preset charged capacity threshold, proceeding to the step of correcting the current SOC value of the battery pack according to the differential capacity curve and the voltage-SOC reference curve of the non-decay zone of the battery pack. In this embodiment, the SOC value of the battery pack is corrected when the charged capacity of the battery pack reaches the preset charged capacity threshold, so as to ensure that the SOC value of the battery pack is corrected after sufficient state information of the battery pack is obtained, which further ensures the accuracy of the corrected SOC value of the battery pack; at the same time, the situation where the SOC value of the battery pack cannot be corrected because the data of the state information of the battery pack is not enough can be avoided.

In addition, before the correcting a current SOC value of the battery pack according to the differential capacity curve and a voltage-SOC reference curve of a non-decay zone of the battery pack, the method may further include: determining whether the charging process of the battery pack has stopped; when the charging process of the battery pack has stopped, proceeding to the step of correcting the current SOC value of the battery pack according to the differential capacity curve and the voltage-SOC reference curve of the non-decay zone of the battery pack. In this embodiment, the SOC value of the battery pack is corrected after the charging process of the battery pack has stopped, which avoids that the correction of the SOC value of the battery pack is repeated for multiple times.

In addition, the acquiring the peak position points of the differential capacity curve may specifically include: selecting a point on the differential capacity curve at which a differential capacity value meets a preset condition and multiple points on both sides of the point at which the preset condition is met to obtain N reference points, where the preset condition is that a differential capacity value at a point is of a maximum or minimum value; calculating the peak position points of the differential capacity curve according to the formula $P_n = \Sigma_{i=1}^{N} D_i \cdot v_i / \Sigma_{i=1}^{N} D_i$; where $D_i$ represents a differential capacity value of an i-th reference point of the N reference points, $V_i$ represents a voltage value of the i-th reference point, Pn represents an n-th peak position point, i is a positive integer greater than or equal to 2, and n is a positive integer greater than or equal to 1. This embodiment provides a specific implementation for acquiring the peak position point of the differential capacity curve.

BRIEF DESCRIPTION OF THE DRAWINGS

Description of one or more embodiments is to be made by way of example with reference to the corresponding drawings, and is not intended to limit the scope of the invention. In the drawings, elements marked with same numbers are to represent like elements. Unless otherwise specified, the drawings are not to scale.

DETAILED DESCRIPTION

In order to make the purposes, technical solutions and advantages of embodiments of the present invention clearer, the embodiments of the present invention will be described in detail with reference to the accompanying drawings. However, it is to be understood by a person of ordinary skill in the art that, in various embodiments of the present invention, numerous technical details are proposed in order to make the present application better understood by readers. However, the technical solutions claimed by the present application can be achieved without these technical details or various changes and modifications based on the following embodiments.

A first embodiment of the present invention relates to a method for correcting a SOC of a battery pack, which is applied to an electric vehicle. According to this method, a SOC of a battery pack of the electric vehicle can be corrected.

Figure 1:
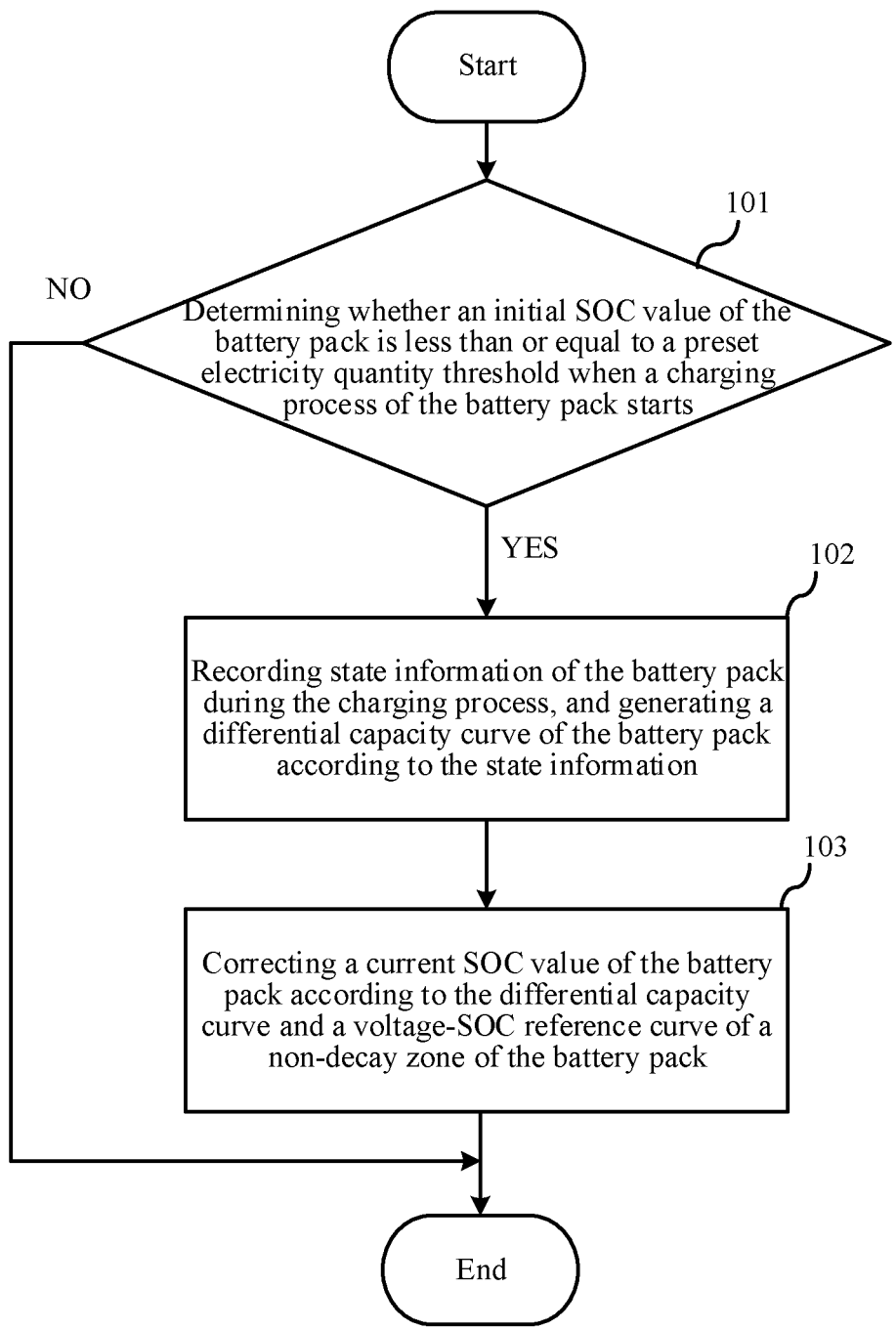
FIG. 1 is a specific flowchart of a method for correcting a SOC of a battery pack according to a first embodiment of the present invention.

The specific flow of the method for correcting a SOC of a battery pack according to this embodiment is shown in FIG. 1.

Step 101: determining whether an initial SOC value of the battery pack is less than or equal to a preset electricity quantity threshold when a charging process of the battery pack starts. If so, the method proceeds to step 102; if not, the method directly ends.

Figure 2:
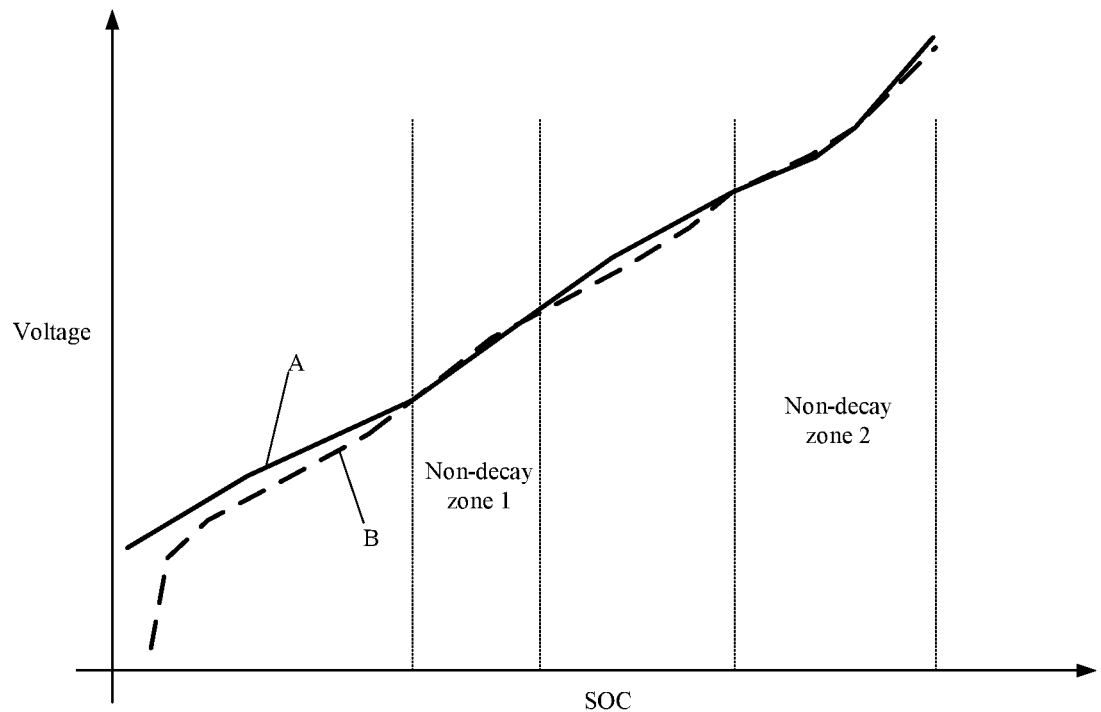
FIG. 2 is a schematic diagram of voltage-SOC curves of a battery pack before and after it is aged according to the first embodiment of the present invention.

Specifically, when a charging port of the electric vehicle is connected to an external charging power source (for example, a charging gun of a charging pile), the charging process of the battery pack of the electric vehicle starts. The initial SOC value of the battery pack is acquired, and it is determined whether the initial SOC value of the battery pack is less than or equal to the preset electricity quantity threshold, where the electricity quantity threshold may be a lower limit of any non-decay zone of the battery pack. That is, it is determined whether the charging range of the battery pack covers at least one non-decay zone of the battery pack. When the initial SOC value of the battery pack is less than or equal to the preset electricity quantity threshold, it means that the charging range of the battery pack covers at least one non-decay zone of the battery pack, and the method proceeds to step 102; otherwise, it means that the charging range of the battery pack does not cover any non-decay zone of the battery pack, then the SOC value of the battery pack will not be corrected during this charging process and the method ends directly. A non-decay zone of the battery pack is a zone where a voltage-SOC curve of the battery pack is not affected by the aging of the battery pack. As shown in FIG. 2, a curve A represents a voltage-SOC curve of the battery pack before it is aged, and a curve B represents a voltage-SOC curve of a battery pack after it is aged. It can be seen that, in non-decay zones 1 and 2, the voltage-SOC curve of the battery pack is substantially unchanged after the battery pack is aged and is not affected by the aging of the battery pack.

In this embodiment, the non-decay zone may be determined by: selecting battery packs with different aging levels, recording voltage-SOC curves of the battery packs during charging processes of the battery packs, and comparing the voltage-SOC curves of the battery packs with different aging levels, and selecting a section of the voltage-SOC curve of the battery pack that is not affected by the aging of the battery pack as a voltage-SOC reference curve of the non-decay zone of the battery pack. After the non-decay zone is determined, a mapping relationship table between a voltage and a SOC value in the non-decay zone can be acquired.

Step 102: recording state information of the battery pack during the charging process, and generating a differential capacity curve of the battery pack according to the state information.

Specifically, the state information may include: a sequence of voltages and a sequence of currents of the battery pack at fixed time intervals. A sequence of voltages of the battery pack at fixed time intervals during the charging process Volt1, Volt2, ..., Volti, and a sequence of currents of the battery pack at fixed time intervals during the charging process I1, I2, ..., Ii are recorded and stored, so that a charged capacity-voltage curve of the battery pack can be generated according to the sequence of voltages and the sequence of currents. Specifically, an a current-over-time integral at each moments in the sequence of currents is calculated, and a sequence of charged capacities of the battery pack at fixed time intervals Cap1, Cap2, ..., Capi may be obtained, thus the charged capacity-voltage curve of the battery pack may be calculated. The voltage of the battery pack may be a voltage across both ends of the battery pack at a certain moment during the charging process of the battery pack.

Figure 3:
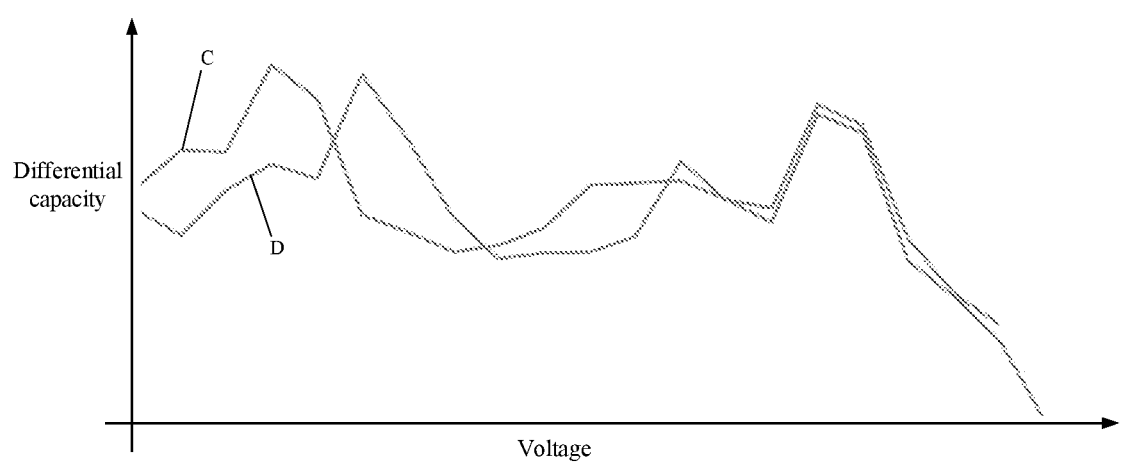
FIG. 3 is a schematic diagram of differential capacity curves of a battery pack before and after it is aged according to the first embodiment of the present invention.

Then, the differential capacity curve of the battery pack is calculated according to the charged capacity-voltage curve. Specifically, charged capacity variations dQ and voltage change rates dVolt between adjacent time intervals are calculated, so that differentials of the charged capacity variations dQ relative to the voltages, i.e., a sequence of differential capacities dQ/dVolt including d1, d2, d3, ..., may be calculated. And then the differential capacity curve of the battery pack is calculated according to the sequence of differential capacities dQ/dVolt and the sequence of voltages Volt1, Volt2, ..., Volti. Referring to FIG. 3, a curve C represents a differential capacity curve of the battery pack before it is aged, and a curve D represents a differential capacity curve of the battery pack after it is aged, where i is a positive integer greater than or equal to 2. After the differential capacity curve of the battery is acquired, a mapping relationship table between differential capacity values and voltages can be obtained.

Step 103: correcting a current SOC value of the battery pack according to the differential capacity curve and the voltage-SOC reference curve of the non-decay zone of the battery pack.

Specifically, the current SOC value of the battery pack is corrected and stored, using the mapping relationship between the voltages and the SOC values in the voltage-SOC reference curve of the non-decay zone of the battery pack and the mapping relationship between the differential capacity values and the voltage values on the differential capacity curve of the battery pack. In an example, the current SOC value of the battery pack may be corrected based on a selected voltage-SOC reference curve of a non-decay zone covered by the charged electricity quantity of the battery pack and the differential capacity curve of the battery pack, so that the amount of calculation is reduced.

Compared with the prior art, according to this embodiment of the present invention, it is determined whether the initial SOC value of the battery pack is less than or equal to the preset electricity quantity threshold when the charging process of the battery pack starts; when the initial SOC value of the battery pack is less than or equal to the preset electricity quantity threshold, the state information of the battery pack during the charging process is recorded, and the differential capacity curve of the battery pack is generated according to the state information; then the current moment SOC of the battery pack is corrected according to the differential capacity curve and the voltage-SOC reference curve of the non-decay zone of the battery pack. Therefore, the SOC value of the battery pack can be corrected during the charging process of the battery pack. Since the voltage-SOC reference curve of the non-decay zone of the battery pack is not be affected by the aging of the battery pack, the influence of battery aging on the calculation of the SOC value of the battery pack is avoided, and the accuracy of the corrected SOC value of the battery pack is improved.

A second embodiment of the present invention relates to a method for correcting a SOC of a battery pack. The second embodiment includes further details in addition to the first embodiment, in which a specific embodiment for correcting the current SOC value of the battery pack according to the differential capacity curve and the voltage-SOC reference curve of the non-decay zone of the battery pack is provided.

Figure 4:
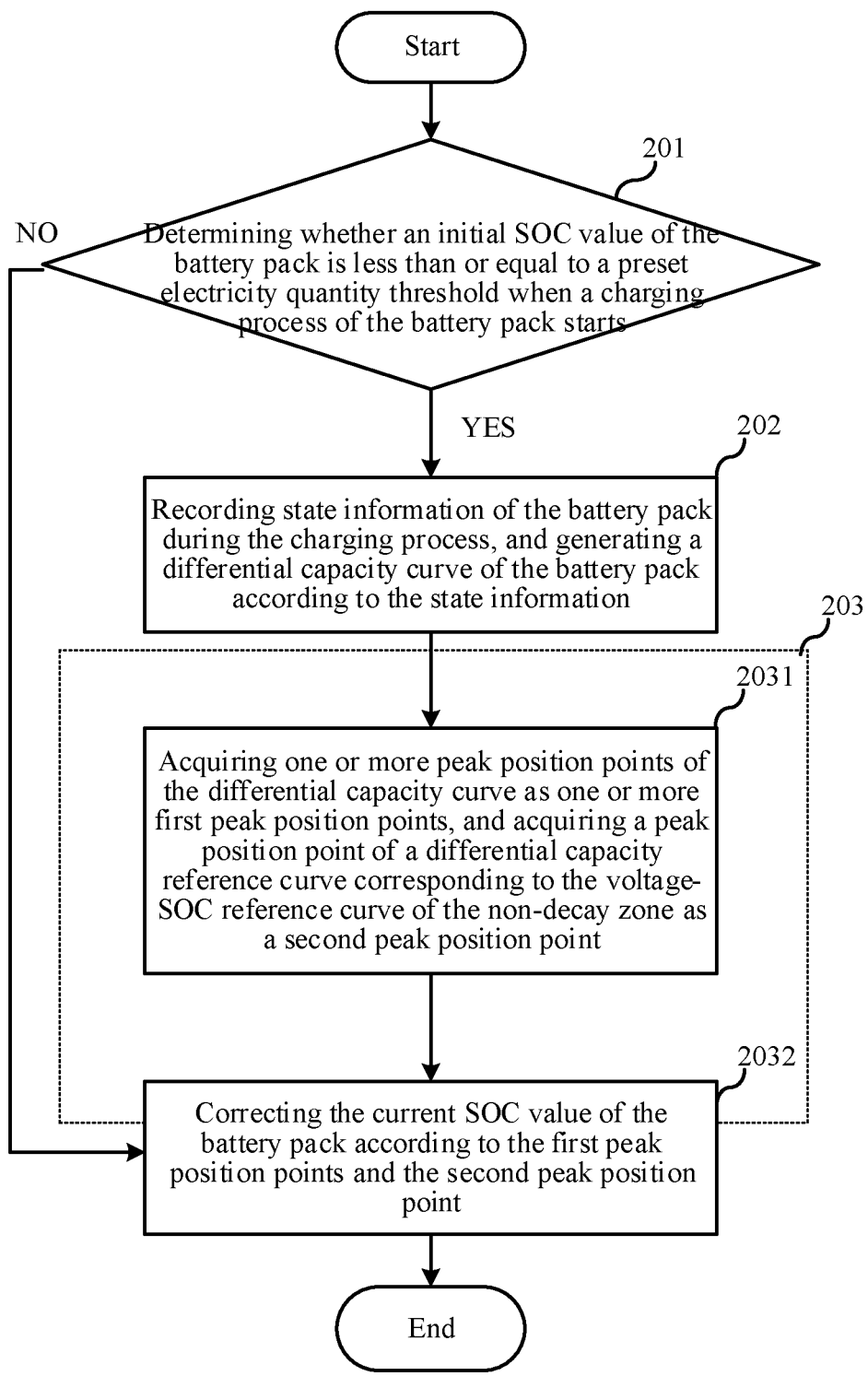
FIG. 4 is a specific flowchart of a method for correcting a SOC of a battery pack according to a second embodiment of the present invention.

The specific flow of the method for correcting a SOC of a battery pack according to this embodiment is shown in FIG. 4.

Step 201 and step 202 are substantially the same as step 101 and step 102, which will not be repeated here. The main difference between the second embodiment and the first embodiment is that step 203 includes the following sub-steps:

Sub-step 2031: acquiring one or more peak position points of the differential capacity curve as one or more first peak position points, and acquiring a peak position point of a differential capacity reference curve corresponding to the voltage-SOC reference curve of the non-decay zone as a second peak position point.

Specifically, there are two approaches for acquiring the peak position points of the differential capacity curve, which are described in more details below.

Approach 1: the mapping relationship table between differential capacity values and voltages may be looked up, so as to acquire, as the peak position points of the differential capacity curve, the points on the differential capacity curve from which the differential capacity value increases regardless of whether the voltage increases or decreases or from which the differential capacity value decreases regardless of whether the voltage increases or decreases. The peak position points include the peaks and troughs of the differential capacity curve, that is, a peak position point is a point whose two adjacent points on the differential capacity curve both have differential capacity values greater than that of the point or both have differential capacity values less than that of the point, and that point is recorded as a first peak position point, and the number of the first peak position points is usually multiple.

Approach 2: the mapping relationship table between differential capacity values and voltages may be looked up, so as to select a point on the differential capacity curve at which a differential capacity value meets a preset condition and multiple points on both sides of the point at which the preset condition is met to obtain N reference points, where the preset condition is that a differential capacity value at the point is a maximum or minimum value. For example, M points on each of the left and right sides of the point with the maximum differential capacity value may be selected, so that 2M+1 reference points may be obtained, and N=2M+1. The peak position points are determined according to the following formula:

$$P_n = \sum_{i=1}^{N} D_i \cdot v_i / \sum_{i=1}^{N} D_i$$

where $D_i$ represents a differential capacity value of an i-th reference point of the N reference points, $V_i$ represents a voltage value of the i-th reference point, Pn represents an n-th peak position, so that n first peak position points may be obtained, i is a positive integer greater than or equal to 2, and n is a positive integer greater than or equal to 1.

According to this embodiment, in the acquiring the peak position points in the voltage-SOC reference curve of the non-decay zone, the charged capacity-voltage reference curve is first acquired according to the voltage-SOC reference curve of the non-decay zone. The differential capacity reference curve is acquired according to the charged capacity-voltage reference curve, and the specific process of the above steps is similar to that in step 102 of the first embodiment and will not be repeated here. Then the peak position point on the differential capacity curve is acquired as the second peak position point according to the approach 1 and the approach 2. Thus, the mapping relationship table between the voltage and the SOC value of each second peak position point can be obtained according to the mapping relationship between voltages and SOC values at each point on the voltage-SOC reference curve of the non-decay zone. The mapping relationship table between the voltage and the SOC value of each second peak position point may be acquired in real-time, or may be acquired and stored in advance.

In light of the above, the mapping relationship table between the differential capacity values and the voltages of each first peak position point and the mapping relationship table between the voltage and the SOC value of each second peak position may be acquired.

Sub-step 2032: correcting the current SOC value of the battery pack according to the first peak position points and the second peak position point.

Specifically, it is first determined whether there is a the first peak position point that matches the second peak position, specifically, it is determined whether there is a difference between a voltage corresponding to a first peak position point and a voltage corresponding to the second peak position point that is less than a preset voltage threshold. When the difference between the voltage corresponding to the first peak position point and the voltage corresponding to the second peak position point is less than the preset voltage threshold, it is indicated that the first peak position point matches the second peak position point; otherwise, it is indicated that none of the first peak position points matches the second peak position point and the error in voltage is too big, thus the SOC value of the battery pack cannot be corrected. When the difference between the voltage corresponding to the first peak position point and the voltage corresponding to the second peak position point is a negative value, the absolute value of the difference is used.

Then a SOC value corresponding to the first peak position point matching the second peak position point is updated with a SOC value corresponding to the second peak position point; Specifically, the SOC value corresponding to the second peak position is acquired according to the voltage-SOC parameter curve, and the SOC value corresponding to the first peak position matching the second peak position point is replaced with the SOC value corresponding to the second peak position point.

Finally, the current SOC value of the battery pack is corrected according to the updated SOC value corresponding to the first peak position. Specifically, the charged capacity $Q_A$ of the battery pack corresponding to the first peak position point matching the second peak position point and the current moment charged capacity $Q_B$ of the battery pack are acquired; then the corrected current SOC value of the battery pack SOC B may be calculated according to the charged capacity $Q_A$ corresponding to the first peak position point, the current moment charged capacity $Q_B$ of the battery pack, and the updated SOC value $SOC_A$ corresponding to the first peak position. The corrected current SOC value of the battery pack SOC B is calculated as: $SOC_B = (Q_B - Q_A)/C_{battery\ pack} + SOC_A$, where the $C_{battery\ pack}$ is a nominal capacity of the battery pack provided by the battery supplier, or a capacity of the batterypack acquired through capacity testing.

Compared with the first embodiment, this embodiment provides a specific implementation for correcting the current SOC value of the battery pack according to the differential capacity curve and the voltage-SOC reference curve of the non-decay zone of the battery pack.

A third embodiment of the present invention relates to a method for correcting a SOC of the battery pack. The third embodiment includes improvements to the first embodiment, and the improvements mainly include that it is additionally determined whether the charged capacity of the battery pack reaches a preset charged electricity-quantity threshold.

Figure 5:
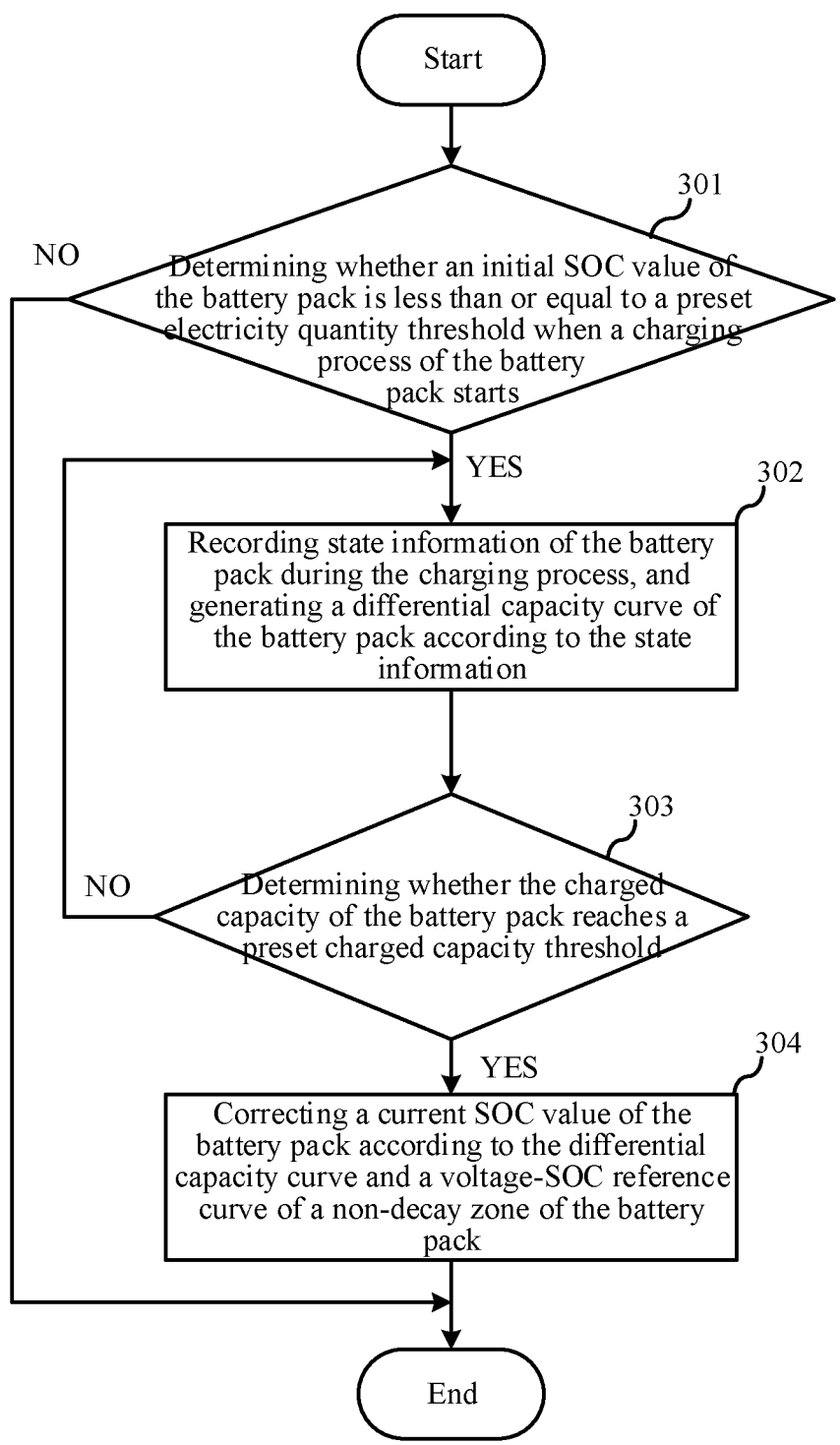
FIG. 5 is a specific flowchart of a method for correcting a SOC of a battery pack according to a third embodiment of the present invention.

The specific flow of the method for correcting a SOC of a battery pack according to this embodiment is shown in FIG. 5.

Step 301 and step 302 are substantially the same as step 101 and step 102, and step 304 is substantially the same as step 103, which will not be repeated here. The main difference between the third embodiment and the first embodiment is that step 303 is additionally included, which is specifically as below:

Step 303: determining whether the charged capacity of the battery pack reaches a preset charged capacity threshold. If so, the method proceeds to step 304; if not, the method proceeds to step 302.

Specifically, it is determined whether the charged capacity of the battery pack reaches the preset charged capacity threshold. When the charged capacity of the battery pack reaches the preset charged capacity threshold, it can be ensured that the recorded state information data of the battery pack is sufficient for accurately deriving the positions of the peak position points of the differential capacity curve, and the method proceeds to step 304 where the current SOC value of the battery pack is corrected according to the differential capacity curve and the voltage-SOC reference curve of the non-decay zone of the battery pack. When the charged capacity of the battery pack does not reach the preset charged capacity threshold, it is indicated that the recorded state information data of the battery pack is relatively little, and it may be impossible to derive the peak position points of the differential capacity curve, that is, the SOC value of the battery pack cannot be corrected; the method returns to step 302, and the recording of the state information of the battery pack during the charging process is continued, and the differential capacity curve of the battery pack is generated according to the state information.

It should be noted that, the voltage and current of the battery pack may fluctuate significantly when the charging process of the battery pack just starts, and it takes for a while for the charging voltage-SOC curve to be consistent with the voltage-SOC reference curve. Therefore, another charged capacity threshold may be set as a second charged capacity threshold, and it is required to ensure that a charged capacity at the first one of the second peak position points in the voltage-SOC reference curve of the non-decay zone during the charging process of the battery pack is greater than the second charged capacity threshold, so as to prevent as far as possible the calculation of the second peak position from being affected by the initial SOC value in the charging process, thus ensuring the accuracy of the obtained second peak position.

Compared with the first embodiment, in this embodiment, the SOC value of the battery pack is corrected when the charged capacity of the battery pack reaches the preset charged capacity threshold, so as to ensure that the SOC value of the battery pack is corrected after sufficient state information of the battery pack is obtained, which further ensures the accuracy of the corrected SOC value of the battery pack; at the same time, the situation where the SOC value of the battery pack cannot be corrected because the data of the state information of the battery pack is not enough can be avoided. It should be noted that, this embodiment may also be considered as an improved embodiment on the basis of the second embodiment, so that it can achieve the same technical effects.

A fourth embodiment of the present invention relates to a method for correcting a SOC of a battery pack. The fourth embodiment includes improvements to the first embodiment, and the improvements mainly include that it is additionally determined whether the charging process of the battery pack has stopped.

Figure 6:
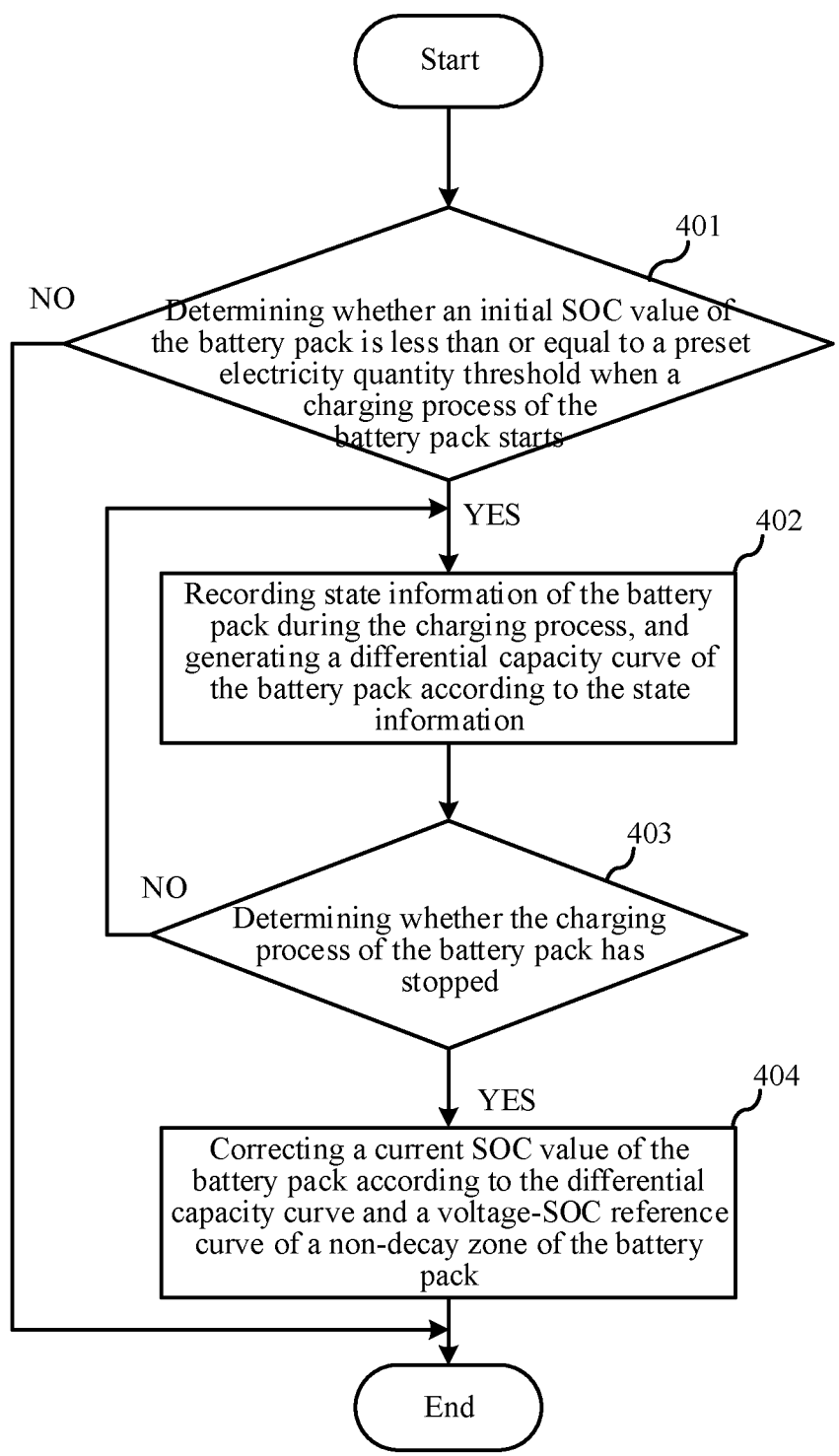
FIG. 6 is a specific flowchart of a method for correcting a SOC of a battery pack according to a fourth embodiment of the present invention.

The specific flow of the method for correcting a SOC of a battery pack according to this embodiment is shown in FIG. 6.

Step 401 and step 402 are substantially the same as step 101 and step 102, and step 404 is substantially the same as step 103, which will not be repeated here. The main difference between the fourth embodiment and the first embodiment is that step 403 is additionally included, which is specifically as below:

Step 403: determining whether the charging process of the battery pack has stopped. If so, the method proceeds to step 404; if not, the method proceeds to step 402.

Specifically, it may be determined whether the charging process of the battery pack has stopped by determining whether the electric vehicle is disconnected from the external charging power source. When the charging process of the battery pack has stopped, the method proceeds to step 404 where the current SOC value of the battery pack is corrected according to the differential capacity curve and the voltage-SOC reference curve of the non-decay zone of the battery pack; when the charging process of the battery pack has not stopped, it is indicated that the battery pack is still being charged, and the method returns to step 402 and the recording of the state information of the battery pack during the charging process is continued, and the differential capacity curve of the battery pack is generated according to the state information.

Compared with the first embodiment, in this embodiment, the SOC value of the battery pack is corrected after the charging process of the battery pack has stopped, which avoids that the correction of the SOC value of the battery pack is repeated for multiple times. It should be noted that, this embodiment may also be considered as an improved embodiment on the basis of the second embodiment or the third embodiment, so that it can achieve the same technical effects.

A fifth embodiment of the present invention relates to a battery management system, which is applied to an electric vehicle. The battery management system includes: at least one processor and a memory communicatively connected with the at least one processor; where, the memory includes instructions executable by the at least one processor and stored in the memory, and the instructions, when being executed by the at least one processor, enable the at least one processor to perform the method for correcting a SOC of a battery pack according to any one of the first to fourth embodiments.

A sixth embodiment of the present invention relates to a vehicle. The vehicle is an electric vehicle, which includes a battery pack and the battery management system according to the fifth embodiment.

It can be understood by those of ordinary skill in the art that, the above-mentioned embodiments are specific embodiments for implementing the present invention, and various changes, in actual applications, can be made in form and details thereto without departing from the spirit and range of the present invention.

What is claimed is:

1. A method for correcting a State of Charge (SOC) of a battery pack, comprising:
   determining, when a charging process of the battery pack starts, whether an initial SOC value of the battery pack is less than or equal to a preset electricity quantity threshold;
   when the initial SOC value of the battery pack is less than or equal to the preset electricity quantity threshold, recording state information of the battery pack during the charging process, and generating a differential capacity curve of the battery pack according to the state information; and
   correcting a current SOC value of the battery pack according to the differential capacity curve and a voltage-SOC reference curve of a non-decay zone of the battery pack,
   wherein the correcting a current SOC value of the battery pack according to the differential capacity curve and a voltage-SOC reference curve of a non-decay zone of the battery pack comprises:
   acquiring one or more peak position points of the differential capacity curve as one or more first peak position points, and acquiring a peak position point of a differential capacity reference curve corresponding to the voltage-SOC reference curve the non-decay zone of as a second peak position point; and
   correcting the current SOC value of the battery pack according to the first peak position points and the second peak position point,
   wherein the correcting the current SOC value of the battery pack according to the first peak position points and the second peak position point comprises:
   determining whether there is a first peak position point that matches the second peak position point;
   when there is a first peak position point matches the second peak position point, updating a SOC value corresponding to the first peak position point matching the second peak position point with a SOC value corresponding to the second peak position point; and
   correcting the current SOC value of the battery pack according to the updated SOC value corresponding to the first peak position point.

2. The method for correcting a SOC of a battery pack according to claim 1, wherein the correcting the current SOC value of the battery pack according to the updated SOC value corresponding to the first peak position point comprises:
   acquiring a charged capacity corresponding to the first peak position point and a current moment charged capacity of the battery pack; and
   calculating the corrected current SOC value of the battery pack according to the charged capacity corresponding to the first peak position point, the current moment charged capacity of the battery pack, and the updated SOC value corresponding to the first peak position point.

3. The method for correcting a SOC of a battery pack according to claim 1, wherein the determining whether there is a first peak position point that matches the second peak position point comprises:
   determining whether there is a difference between a voltage corresponding to the first peak position point and a voltage corresponding to the second peak position point that is less than a preset voltage threshold; and when the difference between the voltage corresponding to the first peak position point and the voltage corresponding to the second peak position point is less than the preset voltage threshold, determining that the first peak position point matches the second peak position point.

4. The method for correcting a SOC of a battery pack according to claim 1, wherein the electricity quantity threshold is a lower limit value of any non-decay zone of the battery pack.

5. The method for correcting a SOC of a battery pack according to claim 1, wherein the state information comprises a sequence of voltages and a sequence of currents of the battery pack at fixed time intervals;
   the generating a differential capacity curve of the battery pack according to the state information comprises:
   generating a charged capacity-voltage curve of the battery pack according to the sequence of voltages and the sequence of currents; and
   calculating the differential capacity curve of the battery pack according to the charged capacity-voltage curve.

6. The method for correcting a SOC of a battery pack according to claim 1, wherein before the correcting a current SOC value of the battery pack according to the differential capacity curve and a voltage-SOC reference curve of a non-decay zone of the battery pack, the method further comprises:
   determining whether the charged capacity of the battery pack reaches a preset charged capacity threshold; and
   when the charged capacity of the battery pack reaches the preset charged capacity threshold, proceeding to the step of correcting the current SOC value of the battery pack according to the differential capacity curve and the voltage-SOC reference curve of the non-decay zone of the battery pack.

7. The method for correcting a SOC of a battery pack according to claim 1, wherein before the correcting a current SOC value of the battery pack according to the differential capacity curve and a voltage-SOC reference curve of a non-decay zone of the battery pack, the method further comprises:
   determining whether the charging process of the battery pack has stopped; and
   when the charging process of the battery pack has stopped, proceeding to the step of correcting the current SOC value of the battery pack according to the differential capacity curve and the voltage-SOC reference curve of the non-decay zone of the battery pack.

8. The method for correcting a SOC of a battery pack according to claim 1, wherein the acquiring the peak position points of the differential capacity curve comprises:
   selecting a point on the differential capacity curve at which a differential capacity value meets a preset condition and multiple points on both sides of the point at which the preset condition is met to obtain N reference points, wherein the preset condition is that a differential capacity value at a point is a maximum or minimum value; and calculating the peak position points of the differential capacity curve according to the formula $P_n = \sum_{i=1}^{N} D_i \cdot v_i / \sum_{i=1}^{N} D_i$;

wherein $D_i$ represents a differential capacity value of an i-th reference point of the N reference points, $V_i$ represents a voltage value of the i-th reference point, Pn represents an n-th peak position point, i is a positive integer greater than or equal to 2, and n is a positive integer greater than or equal to 1.

9. A battery management system comprising at least one processor and
a memory communicatively connected with the at least one processor; wherein
the memory comprises instructions executable by the at least one processor and stored in the memory, and the instructions, when executed by the at least one processor, enable the at least one processor to
determine, when a charging process of the battery pack starts, whether an initial SOC value of the battery pack is less than or equal to a preset electricity quantity threshold;
when the initial SOC value of the battery pack is less than or equal to the preset electricity quantity threshold, record state information of the battery pack during the charging process, and generate a differential capacity curve of the battery pack according to the state information; and
correct a current SOC value of the battery pack according to the differential capacity curve and a voltage-SOC reference curve of a non-decay zone of the battery pack,
wherein the instructions further enable the at least one processor to
acquire one or more peak position points of the differential capacity curve as one or more first peak position points, and acquire a peak position point of a differential capacity reference curve corresponding to the voltage-SOC reference curve the non-decay zone of as a second peak position point; and
correct the current SOC value of the battery pack according to the first peak position points and the second peak position point,
wherein the instructions further enable the at least one processor to
determine whether there is a first peak position point that matches the second peak position point;
when there is a first peak position point matches the second peak position point, update a SOC value corresponding to the first peak position point matching the second peak position point with a SOC value corresponding to the second peak position point; and
correct the current SOC value of the battery pack according to the updated SOC value corresponding to the first peak position point.

10. The battery management system according to claim 9, wherein the instructions further enable the at least one processor to
acquire a charged capacity corresponding to the first peak position point and a current moment charged capacity of the battery pack; and
calculate the corrected current SOC value of the battery pack according to the charged capacity corresponding to the first peak position point, the current moment charged capacity of the battery pack, and the updated SOC value corresponding to the first peak position point.

11. The battery management system according to claim 9, wherein the instructions further enable the at least one processor to
determine whether there is a difference between a voltage corresponding to the first peak position point and a voltage corresponding to the second peak position point that is less than a preset voltage threshold; and
when the difference between the voltage corresponding to the first peak position point and the voltage corresponding to the second peak position point is less than the preset voltage threshold, determine that the first peak position point matches the second peak position point.

12. The battery management system according to claim 9, wherein the electricity quantity threshold is a lower limit value of any non-decay zone of the battery pack.

13. The battery management system according to claim 9, wherein the state information comprises a sequence of voltages and a sequence of currents of the battery pack at fixed time intervals;
the instructions further enable the at least one processor to
generate a charged capacity-voltage curve of the battery pack according to the sequence of voltages and the sequence of currents; and
calculate the differential capacity curve of the battery pack according to the charged capacity-voltage curve.

14. The battery management system according to claim 9, wherein the instructions further enable the at least one processor to
determine whether the charged capacity of the battery pack reaches a preset charged capacity threshold; and
when the charged capacity of the battery pack reaches the preset charged capacity threshold, proceed to the step of correcting the current SOC value of the battery pack according to the differential capacity curve and the voltage-SOC reference curve of the non-decay zone of the battery pack.

15. The battery management system according to claim 9, wherein the instructions further enable the at least one processor to
determine whether the charging process of the battery pack has stopped; and
when the charging process of the battery pack has stopped, proceed to the step of correcting the current SOC value of the battery pack according to the differential capacity curve and the voltage-SOC reference curve of the non-decay zone of the battery pack.

16. The battery management system according to claim 9, wherein the instructions further enable the at least one processor to
select a point on the differential capacity curve at which a differential capacity value meets a preset condition and multiple points on both sides of the point at which the preset condition is met to obtain N reference points, wherein the preset condition is that a differential capacity value at a point is a maximum or minimum value; and
calculate the peak position points of the differential capacity curve according to the formula $P_n = \sum_{i=1}^{N} D_i \cdot v_i / \sum_{i=1}^{N} D_i$;
wherein $D_i$ represents a differential capacity value of an i-th reference point of the N reference points, $V_i$ represents a voltage value of the i-th reference point, Pn represents an n-th peak position point, i is a positive integer greater than or equal to 2, and n is a positive integer greater than or equal to 1.

\* \* \* \* \*